United States Patent [19]

Terada

[11] Patent Number: 5,343,091
[45] Date of Patent: Aug. 30, 1994

[54] SEMICONDUCTOR LOGIC INTEGRATED CIRCUIT HAVING IMPROVED NOISE MARGIN OVER DCFL CIRCUITS

[75] Inventor: Toshiyuki Terada, Tokyo, Japan

[73] Assignee: Kabushiki Kaisha Toshiba, Kawasaki, Japan

[21] Appl. No.: 11,155

[22] Filed: Jan. 29, 1993

[30] Foreign Application Priority Data

Jan. 31, 1992 [JP] Japan .................................. 4-016657
Sep. 3, 1992 [JP] Japan .................................. 4-236112

[51] Int. Cl.$^5$ ............................................. H03K 17/08
[52] U.S. Cl. ..................................... 307/448; 307/443
[58] Field of Search ................ 307/443, 448, 450, 475

[56] References Cited

U.S. PATENT DOCUMENTS

| | | | |
|---|---|---|---|
| 4,800,303 | 1/1989 | Graham et al. | 307/475 X |
| 4,810,969 | 3/1984 | Fulkerson | 307/448 X |
| 4,926,071 | 5/1990 | MacMillan et al. | 307/475 |
| 4,935,647 | 6/1990 | Lankins | 307/450 |
| 4,965,464 | 10/1990 | Von Basse et al. | 307/450 X |
| 5,077,494 | 12/1991 | Bowers et al. | 307/450 X |
| 5,077,496 | 12/1991 | Wolczanski | 307/450 X |

OTHER PUBLICATIONS

Yu et al., "Low Power 2K-Cell SDFL Gate Array and DCFL Circuits Using GaAs Self-Aligned E/D Mesfets", *IEEE J.S.S.C.*, vol. 23, No. 1, Feb. 1988, pp. 224-238 (307/450).

Proceedings of the IEEE 1991 Custome Integrated Circuits Conference, May 1991, Norio Higashisaka, et al., pp. 14.6.1 to 14.6.4, "A Quasi-Complementary-Logic GaAs Gate Array Emplo Lization Technology".

Proceedings of the IEEE 1990 Custom Integrated Circuits Conference, May 1990, W. B. Leung, et al., pp. 24.8.1 to 24.8.3, "3.5K Gate 32-Bit Alu Using GaAs HFET Technology".

IEEE Journal of Solid-State Circuits, vol. 26, No. 1, Jan. 1991, pp. 70-74, David E. Fulkerson, "Feedback FET Logic: A Robust, High-Speed, Low-Power GaAs Logic Family".

*Primary Examiner*—David R. Hudspeth
*Attorney, Agent, or Firm*—Oblon, Spivak, McClelland, Maier & Neustadt

[57] ABSTRACT

A semiconductor logic integrated circuit of this invention comprises a source follower-type switching stage A in which loads MESFET-$Q_{LU}$ and MESFET-$Q_{LD}$ are provided for the drain and source of a switching MESFET-$Q_{SW}$, respectively, a push-pull-type buffer stage C composed of a pull-up MESFET-$Q_{PU}$ and a pull-down MESFET-$Q_{PD}$, and a feedback stage B provided between those two stages, which contains a MESFET-$Q_{FB}$ for feedback control of the output potential and a level-regulating diode $D_2$.

8 Claims, 15 Drawing Sheets

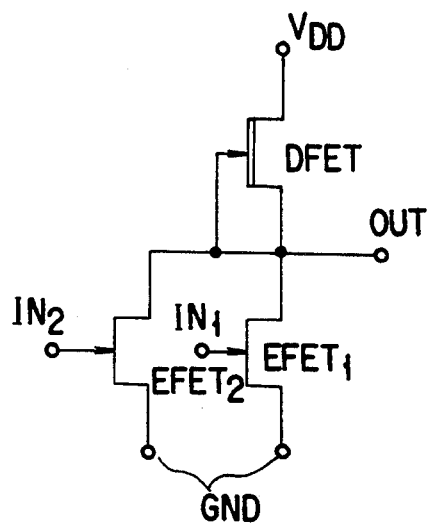
FIG. 1A
(PRIOR ART)
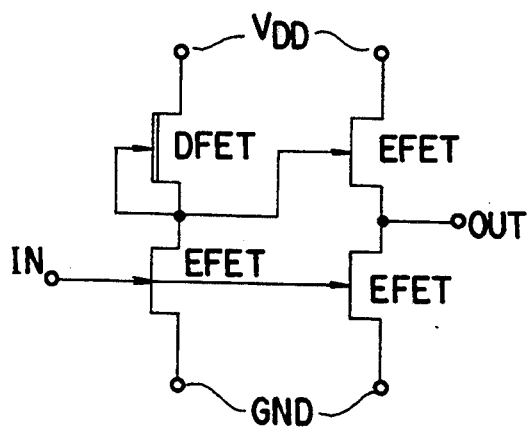 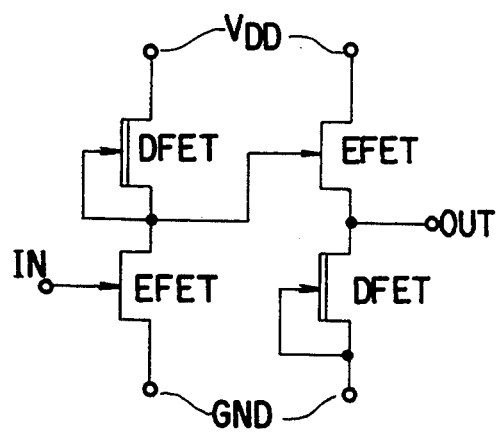
FIG. 1B
(PRIOR ART)
FIG. 1C
(PRIOR ART)

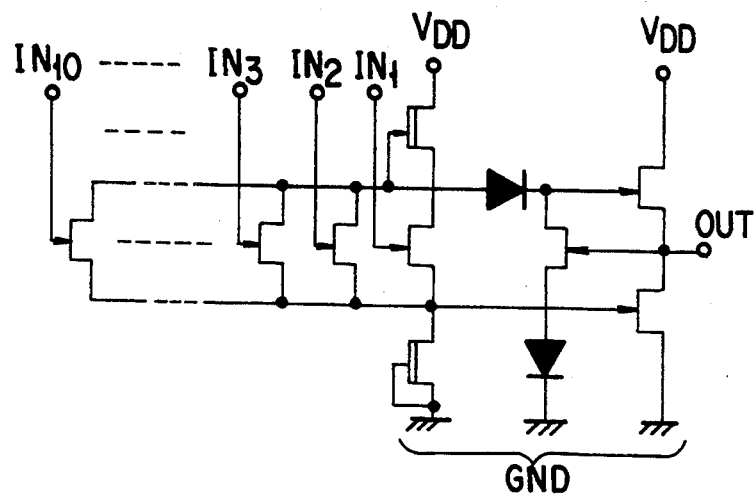
F I G. 3A
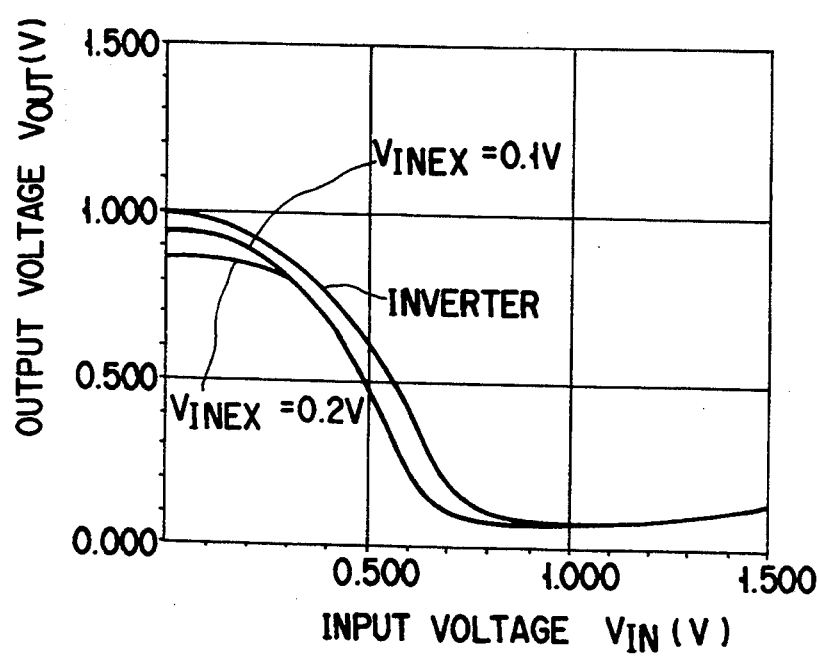
F I G. 3B

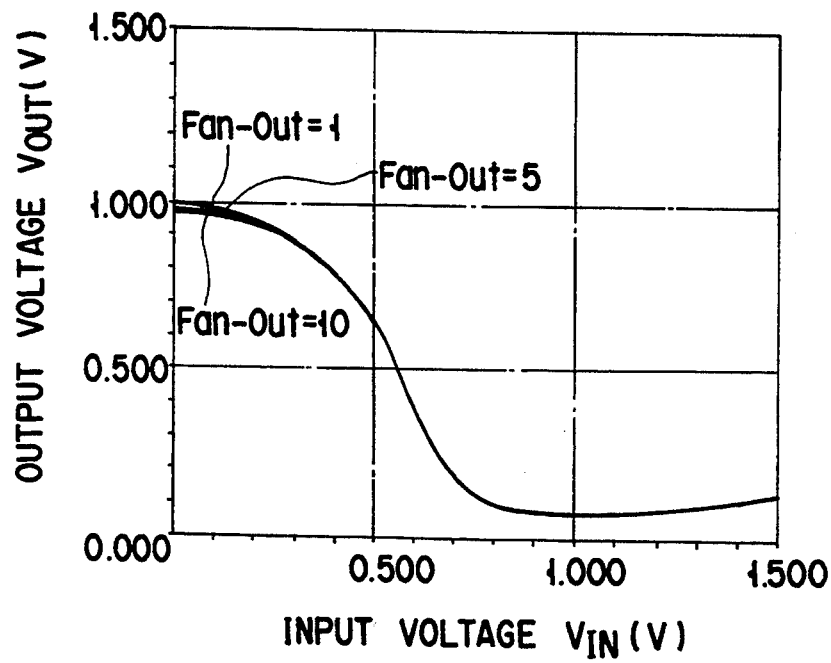
F I G. 5A

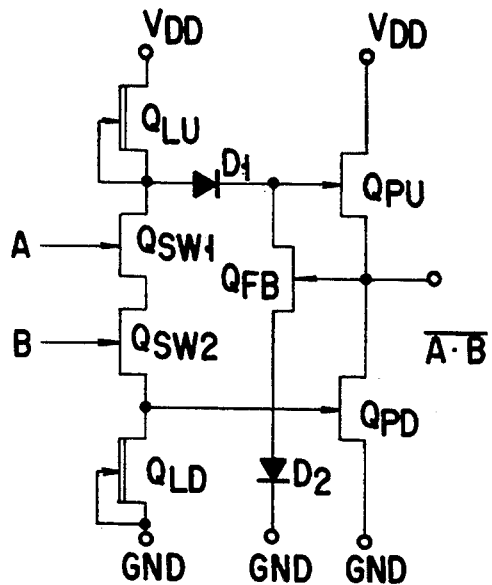
F I G. 6A
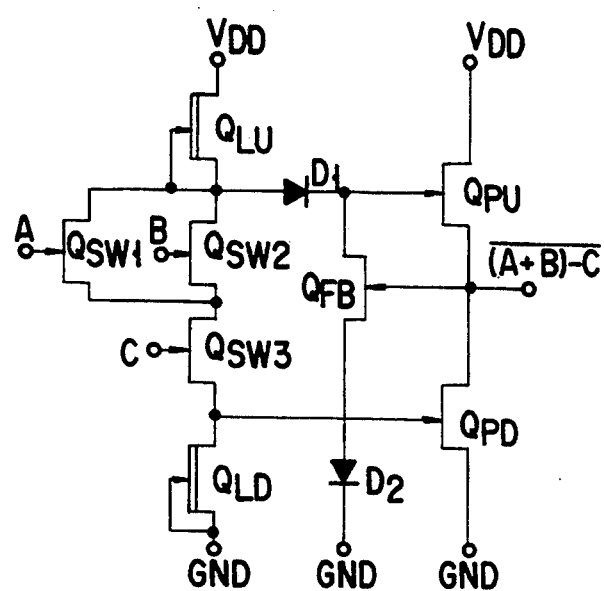
F I G. 6B
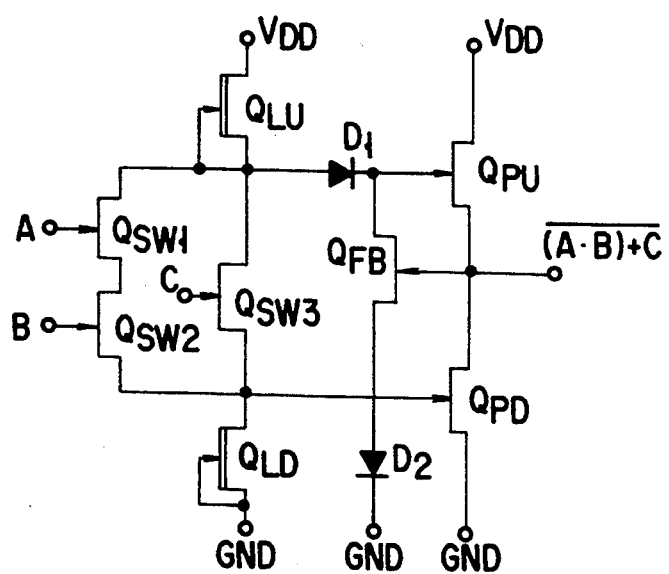
F I G. 6C

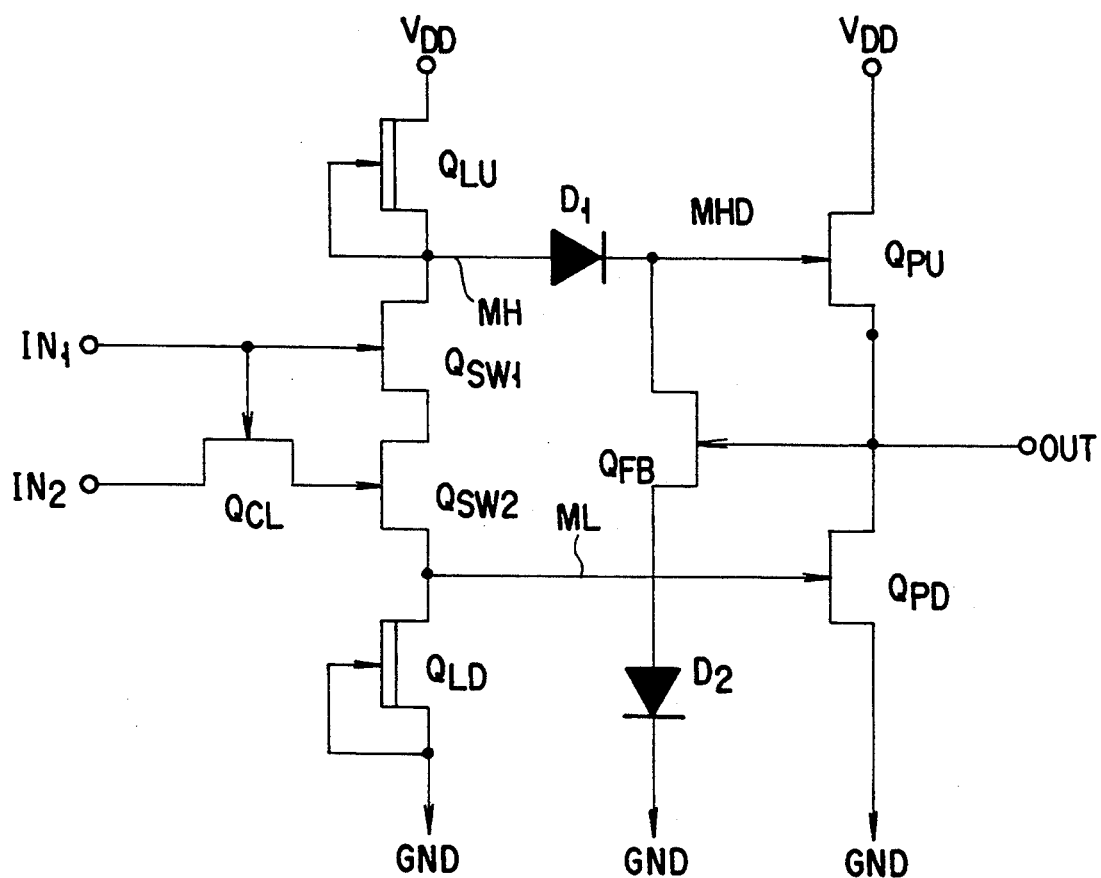
F I G. 8

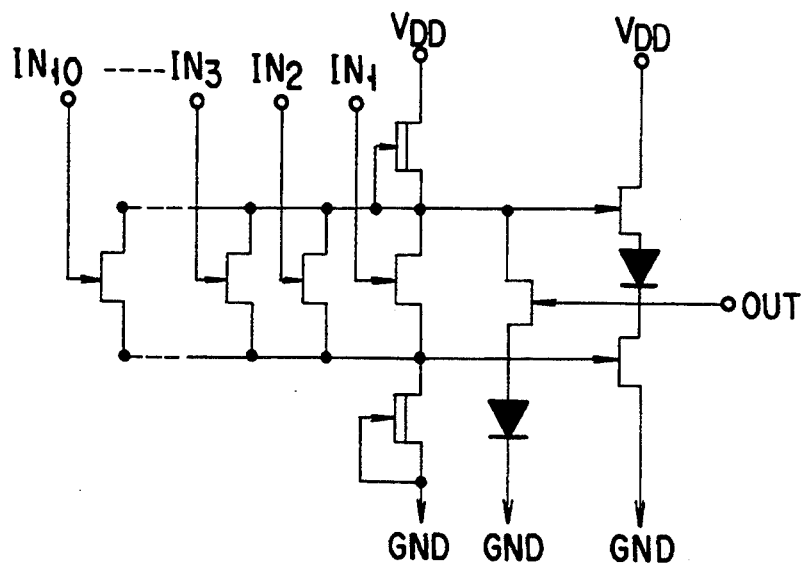
F I G. 10A
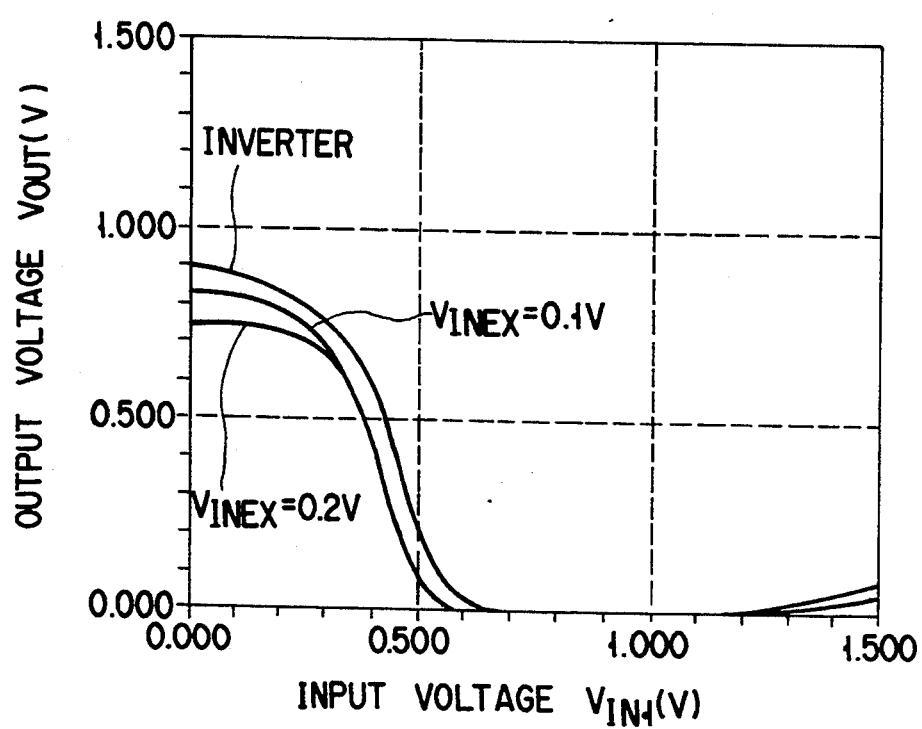
F I G. 10B

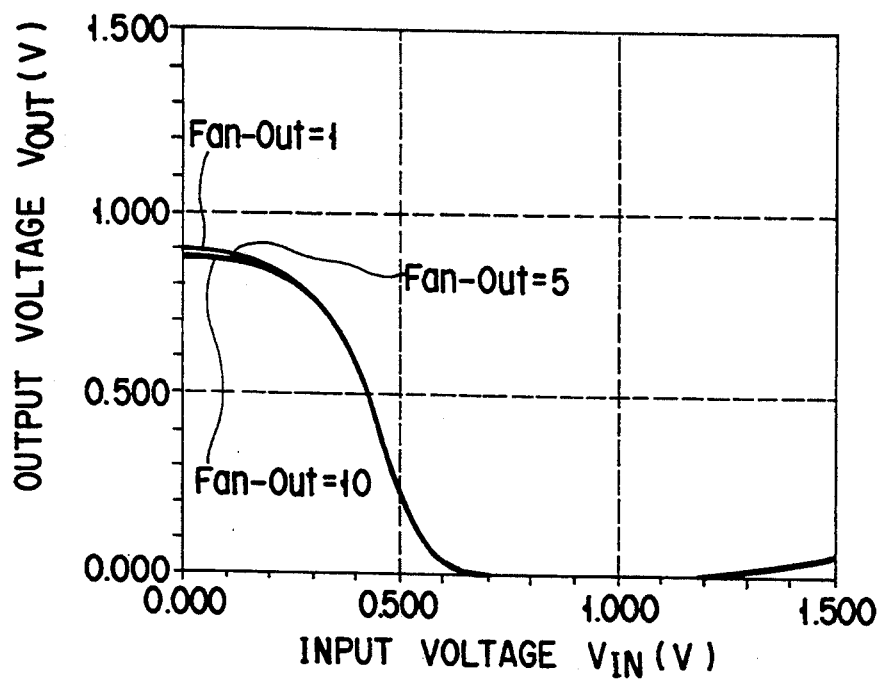
F I G. 12A

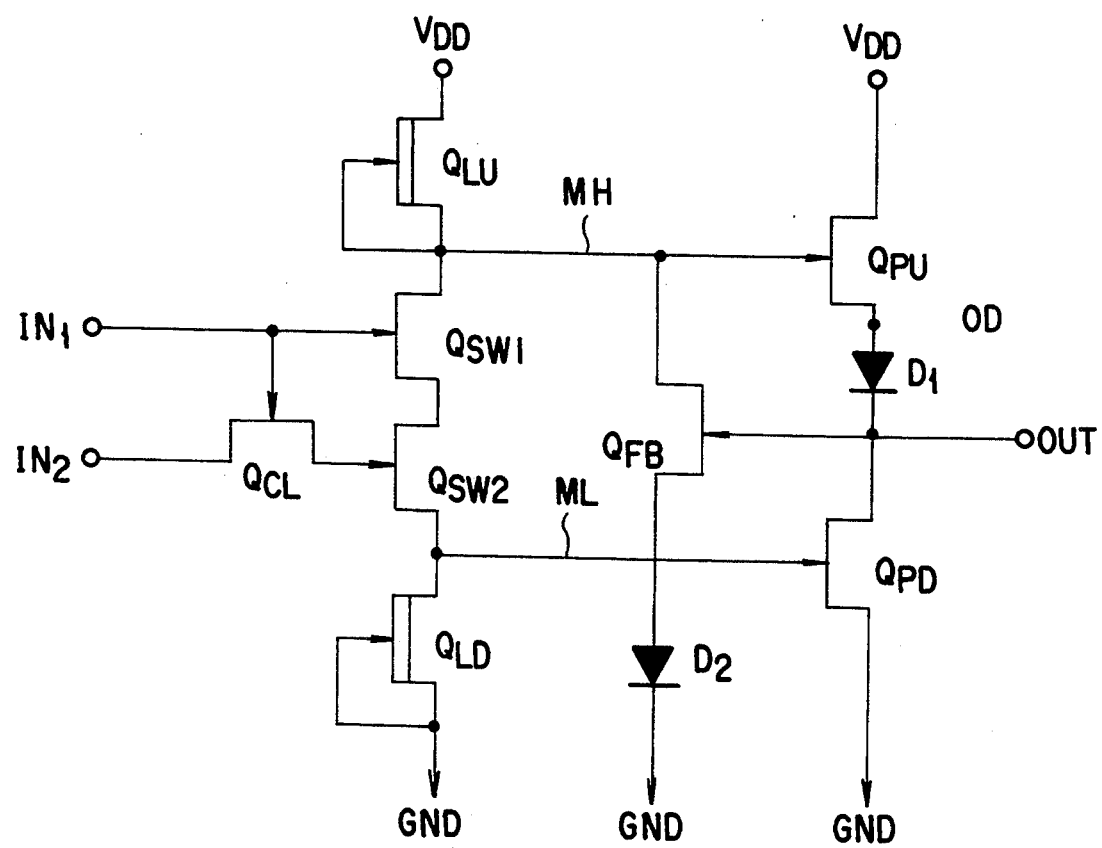
F I G. 15

SEMICONDUCTOR LOGIC INTEGRATED CIRCUIT HAVING IMPROVED NOISE MARGIN OVER DCFL CIRCUITS

BACKGROUND OF THE INVENTION

1. Field of the Invention

This invention relates to a semiconductor logic integrated circuit composed of junction gate field-effect transistors.

2. Description of the Related Art

GaAs logic integrated circuits are attracting attention because of their high speed operation and low power consumption, and now undergo vigorous developments for higher speed and much larger-scale integration. Various types of basic circuits of GaAs logic integrated circuits have been proposed. Among them, direct-coupled FET logic (DCFL) circuits are widely used particularly for purposes of higher integration. DCFL circuits have advantages of low power consumption, operation on a single power supply, and high packing density.

FIG. 1A shows a DCFL 2-input NOR circuit. This circuit is made up of switching elements $EFET_1$ and $EFET_2$ of normally-off MESFETs, and a load element DFET of a normally-on MESFET. The DFET, whose gate and source are connected to each other, acts as a constant-current load. The gates of $EFET_1$ and $EFET_2$ are signal input terminals $IN_1$ and $IN_2$, respectively. When one of input terminals $IN_1$ or $IN_2$ goes to a high (Hi) level, the output terminal OUT drops to a low (Lo) level. When both input terminals $IN_1$ and $IN_2$ are at the Lo level, a Hi level output appears at the output terminal OUT.

The above DCFL circuit, which is of a simple arrangement with a small number of elements, has the following disadvantages:

(1) The noise margin is small because the logic amplitude is small. The reason for this is that since the gate electrode of a GaAs MESFET is of a Schottky junction, current flows between the gate and source of the next stage during the Hi level output, which clamps the Hi level output at the forward-direction rising voltage (normally, 0.6 to 0.8 V) at the Schottky junction. Therefore, the DCFL circuit is liable to be affected to fluctuations in the threshold value ($V_{th}$) due to process variations, making it difficult to achieve a high yield stably.

(2) The load driving capability is low. The reason for this is that since, to obtain a sufficiently low level output, the current capacity of the DFET cannot be made very large, it takes time to charge the output from the Lo level to the Hi level when the output terminal OUT is connected to a heavy load. As a result, the switching speed becomes low.

(3) The logical capability is low. The logical capability shows how many logical functions can be realized with a single logic gate. The higher the logical capability, the smaller the number of gates used to realize a complex logic circuit. This helps to achieve low power consumption and high speed operation. Because the DCFL circuit has a small logic amplitude as noted earlier, the threshold value of an E-type FET used as a switching element is set nearly equal to the Lo level of the DCFL gate. Even when the gate voltage is the threshold voltage, however, the FET cannot cut off the drain current completely, carrying a very small current. This current is what is called a subthreshold current. For this reason, when the number of inputs increases in composing a DCFL NOR gate, current from the constant-current load flows through the E-type FET that should have been off. Consequently, as the number of NOR inputs increases, the Hi level drops accordingly. Because of this, in the DCFL circuit, the maximum number of inputs to the NOR circuit is limited to approximately 4 to 5. To realize a NOR logic with the number of inputs larger than 5, it is necessary to connect logic gates in multiple stages.

To eliminate such disadvantages, various circuits have been proposed.

FIG. 1B shows a DCFL circuit added with a push-pull buffer (hereinafter, simply referred to as a buffer), which is called a supper buffer FET logic (SBFL) circuit. This circuit enables a high speed operation, since two E-type FETs constituting the buffer stage rapidly charge the load capacitance at the output terminal. In contrast, during the Hi level output, the pull-up FET at the upper part of the buffer stage carries a large current, resulting in nearly three times as much power consumption as that of the basic DCFL circuit. The noise margin of this circuit is improved a little, but almost equals that of the basic DCFL circuit. Further, the disadvantage of a low logical capability is not improved very much with this circuit.

FIG. 1C shows a circuit in which a source follower buffer is added to the output stage of the DCFL circuit. By parallel-connecting E-type FETs at the upper part of the source flower stage in the circuit, what is called wired-OR logic is possible, which makes the logical capability greater than that of the DCFL circuit. In addition, this circuit has a larger driving capability. In this circuit, however, current flows through the source follower stage during the Hi level output, resulting in a larger power consumption. When the output terminal drops to the low level, charges are removed via the constant-current load composed of D-type FETs, making the driving capability low as compared with an active operation of pull-down FETs, such as a push-pull operation.

As described above, the DCFL circuit used as a basic circuit of conventional GaAs integrated circuits has the disadvantages of a small noise margin, a low load driving capability, and a low logic capability, which makes it impossible to make full use of the high-speed performance of GaAs MESFETs. There is also the problem that the yield drops significantly, when the threshold value varies as a result of process variations. Circuits proposed to solve those disadvantages of the DCFL circuit also have problems such as increasing the power consumption, and have not yet reached essential solutions.

SUMMARY OF THE INVENTION

The object of the present invention is to provide a semiconductor logic integrated circuit which has a noise margin larger than that of conventional DCFL circuits, and enables a high speed operation at low power consumption.

A first semiconductor logic integrated circuit of the invention powered by at least a first through fifth power supplies and having a first logic input terminal and a logic output terminal, is characterized by comprising: a switching stage which contains a first load with a first end and a second end, the first end being connected to the first power supply, a second load with a first end and a second end, the first end being connected to the second power supply, and a first junction gate field-effect transistor having a drain connected to the second end of the first load, a source connected to the second end of the second load, and a gate connected to the first logic input terminal; a buffer stage which contains a second junction gate field-effect transistor having a drain connected to the third power supply, a source connected the logic output terminal, and a gate, and a third junction gate field-effect transistor having a drain connected to the logic output terminal, a source connected to the fourth power supply, and a gate connected to the source of the first junction gate field-effect transistor; and a feedback stage which contains a level shift element having a first end connected to the drain of the first junction gate field-effect transistor and a second end connected to the gate of the second junction gate field-effect transistor, and a fourth junction gate field-effect transistor having a drain connected to the second end of the level shift element, and a gate connected to the logic output terminal, and a source connected to the fifth power supply.

A second semiconductor logic integrated circuit of the invention powered by at least a first through fifth power supplies and having a first logic input terminal and a logic output terminal, is characterized by comprising: a switching stage which contains a first load with a first end and a second end, the first end being connected to the first power supply, a second load with a first end and a second end, the first end being connected to the second power supply, and a first junction gate field-effect transistor having a drain connected to the second end of the first load, a source connected to the second end of the second load, and a gate connected to the first logic input terminal; a buffer stage which contains a level shift element with a first end and a second end, the first end being connected to the logic output terminal, a second junction gate field-effect transistor having a drain connected to the third power supply, a source connected to the second end of the level shift element, and a gate connected to the drain of the first junction gate field-effect transistor, and a third junction gate field-effect transistor having a drain connected to the logic output terminal, a source connected to the fourth power supply, and a gate connected to the source of the first junction gate field-effect transistor; and a feedback stage which contains a fourth junction gate field-effect transistor having a drain connected to the gate of the second junction gate field-effect transistor, a gate connected to the logic output terminal, and a source connected to the fifth power supply.

Further, a semiconductor logic integrated circuit of the invention is characterized in that the feedback stage further contains a level shift element having a first end connected to the source of the fourth junction gate field-effect transistor and a second end connected to the fifth power supply.

Still further, a semiconductor logic integrated circuit of the present invention is characterized in that the semiconductor logic integrated circuit is further powered by a sixth power supply, and the feedback stage further contains a seventh junction gate field-effect transistor having a drain connected to the gate of the second junction gate field-effect transistor, a gate connected to the source of the first junction gate field-effect transistor, and a source connected to the sixth power supply.

In the present invention, since a feedback stage is provided between a switching stage to which a logic signal is supplied and a buffer stage that performs a push-pull operation to produce a logic output, the gate voltage of the pull-up FET (the second junction gate field-effect transistor) in the buffer stage becomes lower than the gate voltage of the pull-down FET (the third junction gate field-effect transistor) during the Lo level output. As a result, the buffer stage performs an almost fully complementary operation, thereby minimizing the passing-through current.

The Hi level output of the logic circuit of the invention is determined as an enough gate voltage for the feedback FET (the fourth junction gate field-effect transistor) in the feedback stage to carry current from the constant-current source connected to the drain of the switching FET. Therefore, unlike the conventional DCFL circuit where the Hi level is determined by the gate-source junction voltage of the next-stage switching FET, the semiconductor logic integrated circuit of the present invention enables the Hi level output to be determined at the output section. Accordingly, with the semiconductor logic integrated circuit of the invention, by setting the Hi level output lower than the forward-direction rising voltage at the next stage, the Hi level can be determined with almost no current flowing in the next stage.

Further, in the case of the DCFL circuit, an increase in the fan-out permits the same current to flow at a low voltage, which lowers the Hi level, making the noise margin smaller. With the circuit of the invention, however, since no current flows in the next stage, the Hi level is kept constant even if the fan-out increases, preventing a decrease in the noise margin.

In a transient state in the invention where the output changes from the Lo level to the Hi level, the gate voltage of the pull-up FET in the buffer stage rises first, and then the load capacitance associated with the output terminal is charged, thereby raising the potential of the output terminal. Therefore, with the present invention, since the gate-source voltage of the pull-up FET remains high until the voltage of the output terminal has risen, a large current is allowed to flow to charge the load capacitance rapidly. Then, when the potential of the output terminal has risen, the gate-source voltage of the pull-up FET becomes low, which turns on the feedback FET of the feedback stage, lowering the gate potential of the pull-up FET. As a result, the present invention enables high-speed switching, and allows the feedback FET to act to suppress the current in the pull-up FET in a normal state, thereby effectively reducing the power consumption.

Still further, in the present invention, the signal input stage is of a source follower arrangement. Therefore, for current to flow from the input terminal into the ground, a high voltage is necessary as compared with the DCFL circuit, or a single Schottky junction stage. As a result, the Hi level can be set higher than that in the DCFL circuit, which makes the logic amplitude larger, improving the noise margin. Thus, with the present invention, a stable operation is assured even when the number of inputs increases in constructing a NOR gate, providing a high logical capability.

In the present invention, since a level shift element is provided for the buffer stage, the gate-source voltage of the pull-up FET in the buffer stage becomes almost zero during the Lo level output. As a result, use of a normally-off FET as a pull-up FET allows the buffer stage to perform an almost fully complementary operation, minimizing the passing-through current.

As described above, with the present invention, by combining a source follower-type switching stage, a push-pull-type buffer stage, and a feedback stage containing a feedback FET between those two stages that determines the output Hi level, it is possible to realize a logic integrated circuit with a large operating margin which enables high-speed switching at low power consumption.

Additional objects and advantages of the present invention will be set forth in the description which follows, and in part will be obvious from the description, or may be learned by practice of the present invention. The objects and advantages of the present invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the present invention and, together with the general description given above and the detailed description of the preferred embodiments given below, serve to explain the principles of the present invention in which:

FIGS. 1A through 1C show logic circuit arrangements of conventional GaAs MESFETs;

FIGS. 3A and 3B are a schematic diagram of a 10-input NOR circuit using the first embodiment circuit, and its input-output characteristic (hereinafter, also referred to as the transfer characteristic) diagram, respectively;

FIGS. 5A and 5B are diagrams of fan-out dependence of the first embodiment circuit and DCFL circuit, respectively;

FIGS. 6A through 6C are schematic diagrams of composite gates based on an inverter circuit of the first embodiment;

FIG. 8 is a circuit diagram of an inverter circuit according to a third embodiment of the present invention;

FIGS. 10A and 10B are a schematic diagram of a 10-input NOR circuit using the fourth embodiment circuit, and its input-output characteristic diagram, respectively;

FIGS. 12A and 12B are diagrams of fan-out dependence of the fourth embodiment circuit and DCFL circuit, respectively;

FIG. 15 is a sixth diagram of an inverter circuit according to a sixth embodiment of the present invention.

DETAILED DESCRIPTION OF THE PREFERRED EMBODIMENTS

Referring to the accompanying drawings, embodiments of the present invention will be explained.

Figure 2:
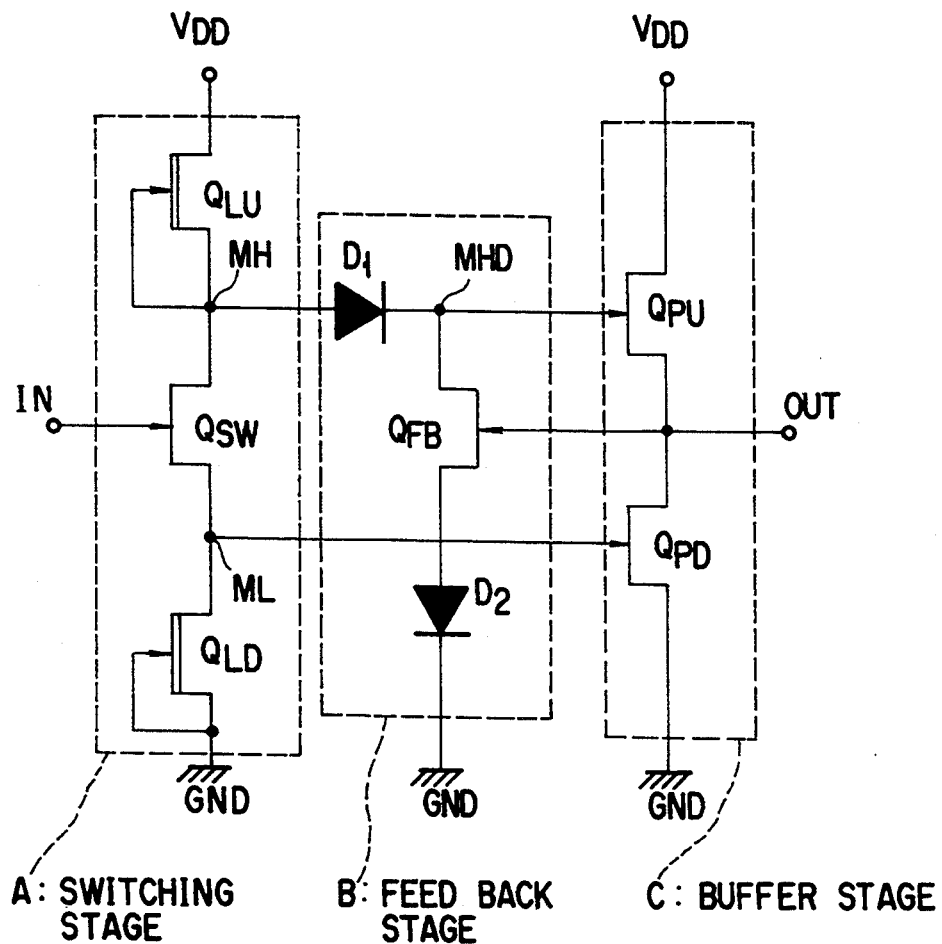
FIG. 2 is a circuit diagram of an inverter circuit according to a first embodiment of the present invention.

FIG. 2 is a schematic diagram of an inverter circuit associated with a first embodiment of the present invention. This inverter circuit is composed of a switching stage A, a feedback stage B, and a buffer stage C which are integrated on a GaAs substrate.

The switching stage A is made up of an E-type GaAs MESFET-$Q_{SW}$ used as a switching element, and D-type GaAs MESFET-$Q_{LU}$ and MESFET-$Q_{LD}$ used as constant-current loads provided between the $Q_{SW}$'s drain and $V_{DD}$ and the $Q_{SW}$'s source and GND, respectively. The junction node of MESFET-$Q_{SW}$ and MESFET-$Q_{LU}$ is indicated by MH, and the junction node of MESFET-$Q_{SW}$ and MESFET-$Q_{LD}$ by ML. The gate of MESFET-$Q_{SW}$ is a signal input terminal IN.

The feedback stage B is composed of a GaAs Schottky diode $D_1$ that shifts the level of node MH's potential, an E-type GaAs MESFET-$Q_{FB}$ for feeding back the output potential, and a GaAs Schottky diode $D_2$ for level regulation. The node level-shifted by diode $D_1$ is indicated by MHD.

The buffer stage C is made up of a pull-up E-type GaAs MESFET-$Q_{PU}$ and a pull-down E-type GaAs MESFET-$Q_{PD}$ connected in series between $V_{DD}$ and GND. The gate of the pull-up MESFET-$Q_{PU}$ is connected to the node MHD of the feedback stage B, whereas the gate of the pull-down MESFET-$Q_{PD}$ is connected to the node ML of the switching stage A. The junction node of those MESFET-$Q_{PU}$ and MESFET-$Q_{PD}$ is the output terminal OUT, which is feedback-connected to the gate of the feedback MESFET-$Q_{FB}$.

A direct-current (DC) action of the inverter circuit of this embodiment will be explained first. When the input signal is at a high (Hi) level, switching MESFET-$Q_{SW}$ turns on. At this time, current $I_{SW}$ flowing through the switching stage A is determined by the smaller of the current capacity of the two loads MESFET-$Q_{LU}$ and MESFET-$Q_{LD}$. The potential of each of nodes MH and ML is determined as a potential that allows MESFET-$Q_{LU}$ and MESFET-$Q_{LD}$ to flow current $I_{SW}$. Those values can be set relatively freely by setting circuit constants suitably.

For example, with the power supply voltage of $V_{DD}=2$ V and GND=0 V, if the potentials at nodes ML and MH are brought to ML=0.4 V and MH=0.5 V, respectively, when switching MESFET-$Q_{SW}$ is on, the pull-down MESFET-$Q_{PD}$ of the buffer stage C turns on. At this time, because node MHD is level-shifted by diode $D_1$, a low (Lo) level output can be produced in a state where the passing-through current in the buffer stage C is small.

Next, when the input signal is at the Lo level, switching MESFET-$Q_{SW}$ turns off, allowing little current to flow. At this time, node ML's potential is almost 0 V because MESFET-$Q_{LD}$ is off, which turns off the pull-down MESFET-$Q_{PD}$. The current $I_L$ from the current source MESFET-$Q_{LU}$ flows in a path running through $D_1$, $Q_{FB}$, and $D_2$ in that order, forming a current mirror circuit. At this time, the output voltage $V_{OUT}$ is determined as a gate voltage required for the feedback MESFET-$Q_{FB}$ to flow current $I_L$. The voltage at node MHD is determined as a gate voltage ($V_{MHD}-V_{OUT}$) needed for pull-up MESFET-$Q_{PU}$ to supply a current corresponding to the output voltage $V_{OUT}$ to a load (generally, the gate input of the next stage) connected to the output terminal.

As described above, the Hi level output voltage of the inverter circuit of the present embodiment can be determined by the circuit constants of the internal circuit without being affected by the load connected to the output terminal. This means that level fluctuations due to the amount of fan-out is small. Therefore, the present invention provides a great noise margin and a high logical capability.

Next, an alternating-current (AC) action of the inverter of the present embodiment will be explained.

When the input voltage $V_{IN}$ changes from the Lo level to the Hi level, node ML goes to approximately 0.4 V, causing the pull-down MESFET-$Q_{PD}$ to turn on. Since node MH is dropped from approximately 1.7 V to approximately 0.5 V, the potential at node MHD is dropped to near 0 V by the feedback MESFET-$Q_{FB}$ and diode $D_1$. This turns off the pull-up MESFET-$Q_{PU}$. As a result, all of the current driving force of the pull-down MESFET-$Q_{PD}$ works only for remaining the charges stored in the capacitance parasitic to the output terminal, causing the output voltage $V_{OUT}$ to drop to approximately 0 V swiftly.

In the case of the DCFL gate, because the load current also flows through the driver MESFET, the MESFET does not operate only for discharging the capacitance at the output terminal.

Next, when the input voltage $V_{IN}$ changes from the Hi level to the Lo level, the node ML is dropped to near 0 V immediately, causing the pull-down MESFET-$Q_{PD}$ to turn off. Nodes MH and MHD are charged by the current from the load MESFET-$Q_{LU}$. This turns on the pull-up MESFET-$Q_{PU}$, placing the output terminal at the Hi level. At this time, the feedback MESFET-$Q_{FB}$ remains off until the output voltage $V_{OUT}$, the voltage at its gate, is charged to a sufficiently high potential. Because of this, when it takes a long time for the pull-up MESFET-$Q_{PU}$ to charge the output terminal because of the large parasitic capacitance at the output terminal, node MHD rises to a high potential, enhancing the current driving capability of pull-up MESFET-$Q_{PU}$. In a state where the output voltage $V_{OUT}$ is sufficiently high, the feedback MESFET-$Q_{FB}$ turns on, which forms a current mirror circuit as explained in the DC action, dropping nodes MH and MHD to the potential in a normal state.

As described above, since the pull-up MESFET-$Q_{PU}$ can flow a large current only when the output terminal is charged, high speed switching is possible even if there is a large parasitic capacitance. In the normal state where the switching is completed after the charging of the output terminal, the gate voltage is dropped by the feedback MESFET-$Q_{FB}$, allowing a very small current to flow. This means that the static current draw is reduced remarkably.

In the present embodiment, the switching stage A only has to drive the relatively small capacitance in the feedback stage B and buffer stage C, making it possible to set the load current for a small amount. The large capacitance parasitic to the output terminal is driven fast by the buffer stage C that does not carry a constant current. Thus, high-speed switching is possible at low power consumption.

Hereinafter, the effects of this embodiment will be explained using a practical example. A basic device used is a GaAs MESFET with a gate length of 0.5 μm. The dimensions of each element in FIG. 2 are set as follows:

$Q_{LU}$: 2 μm, $Q_{SW}$: 4 μm, $Q_{LD}$: 3 μm
$Q_{FB}$: 2 μm, $D_1$: 2 μm, $D_2$: 2 μm
$Q_{PU}$: 10 μm, $Q_{PD}$: 10 μm

MESFET-$Q_{LU}$ and MESFET-$Q_{LD}$ are of the D type with a threshold voltage of $-0.3$ V. $D_1$ and $D_2$, which are D-type MESFETs whose source and drain are short-circuited, are used as diodes. The other MESFETs are of the E type with a threshold voltage of $+0.1$ V. The power supply has $V_{DD}=2$ V and GND=0 V.

Under such conditions, a 10-input NOR gate circuit using inverter circuits of the present embodiment as basic components, and its input-output characteristics are shown in FIGS. 3A and 3B. For reference, FIG. 3B shows the inverter's transfer characteristic, and that in cases where a Lo level of 0.1 V and 0.2 V is supplied to those ($V_{INEX}$) of the 10 inputs other than the inputs to which the switching signal is supplied.

Figure 4A:
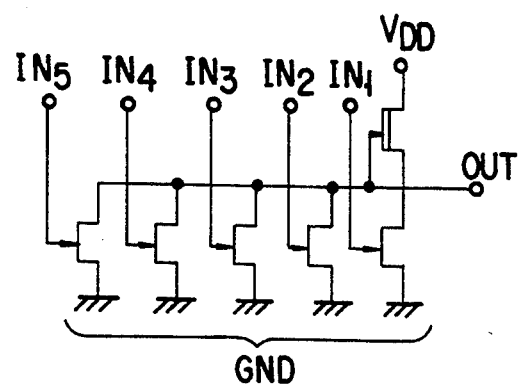
FIGS. 4A and 4B are a schematic diagram of a 5-input NOR circuit using a DCFL circuit, and its input-output characteristic diagram, respectively.
Figure 4B:
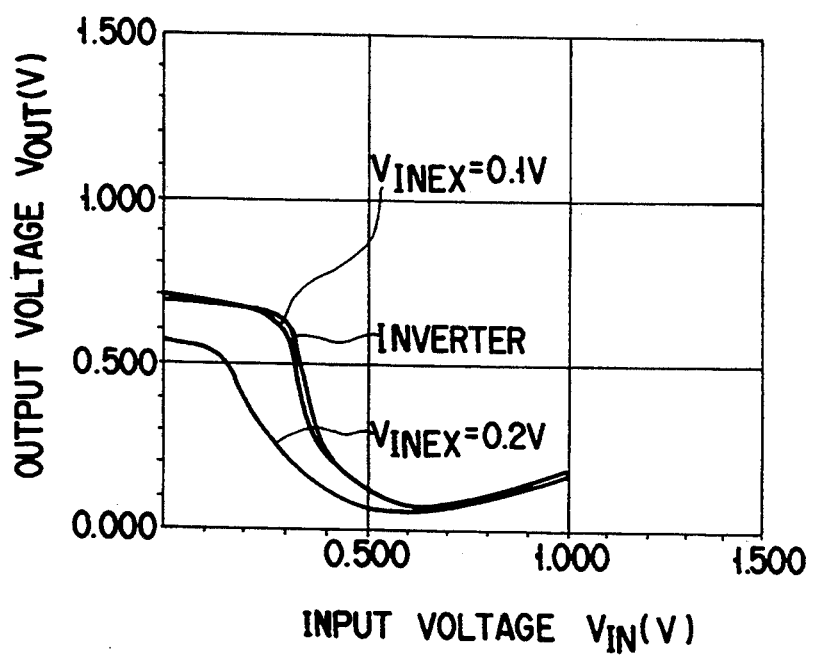

FIGS. 4A and 4B show a schematic diagram of a DCFL 5-input NOR gate and its input-output characteristics for the purpose of comparing with the prior art.

From comparison of the measurements of the transfer characteristic in FIGS. 3B and 4B, it can be seen that in the DCFL circuit, when a normal Lo level, $V_{INEX}=0.1$ V, is supplied, it exhibits the proper transfer characteristic, but when a little high Lo level, $V_{INEX}=0.2$ V, is supplied (assuming that there is a rise in potential due to the resistance of the GND wire and the like), the Hi level output drops significantly. In contrast to this, with the present embodiment, although the number of inputs is 10, twice that of the DCFL circuit, the proper transfer characteristic is maintained even when $V_{INEX}=0.2$ V. Thus, the circuit of the present invention has a sufficient operating margin.

Figure 5B:
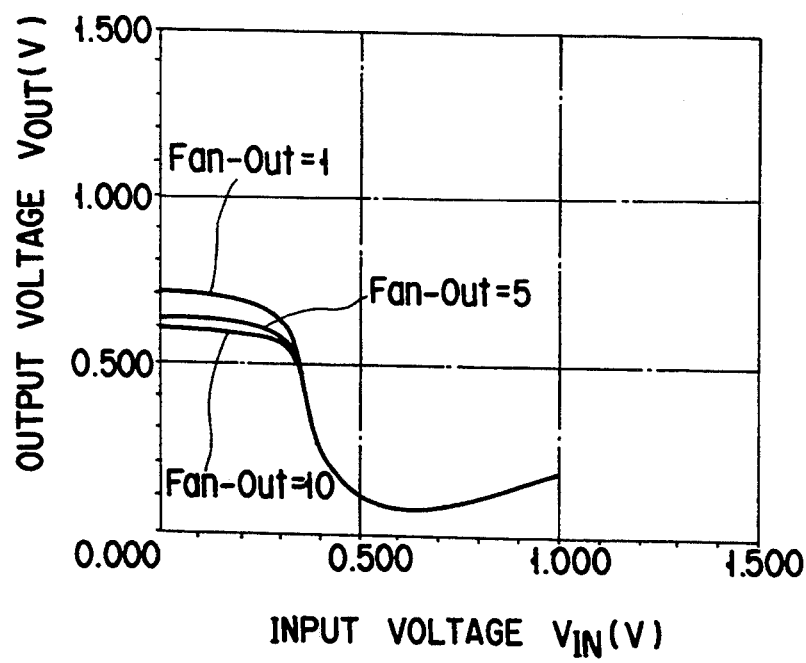

Next, the fan-out dependence of the transfer characteristic in the inverter circuit of the present embodiment and that of the DCFL circuit are shown in FIGS. 5A and 5B, respectively. FIG. 5A shows the transfer characteristic when the inverter of this embodiment is connected with one, five, and ten of the same inverters, that is, the amount of fan-out is 1, 5, and 10. FIG. 5B shows that for the DCFL circuit.

It can be seen that in the DCFL circuit, as the amount of fan-out increases, the Hi level drops accordingly, and at the fan-out=10, the Hi level decreases by approximately 0.1 V as compared with the amount of fan-out=1. In this embodiment, however, a drop in the level is as small as 30 mV even when the amount of fan-out=10, as shown in FIG. 5A.

With the logic circuit arrangement of the present invention, it is easy to realize what is called a composite gate based on an arrangement in which switching elements are cascade-connected. Generally, in a logic gate using GaAs, it is technically difficult to cascade-connect switching MESFETs, when a source follower is used in the input section as found in the present invention. The reason for this is when a Hi level input is supplied to the gate of the lower stage of the cascade-connected MESFETs, current flows through the MESFET via the gate, which raises the potential of the drain (corresponding to the potential of node ML in FIG. 2), preventing the proper logic operation. Because of this, it is necessary to provide a current limiting means for the input section in a logic circuit that contains the source follower-type input section.

With the logic circuit arrangement of the present invention, the Hi level output is supplied as a voltage to a current mirror circuit formed in the logic circuit, not as the forward-direction voltage of the next stage, as described above. Because of this, it is possible to set a Hi level output that allows no current to flow into the next stage. Consequently, with the present invention, it is possible to cascade-connect switching FETs easily.

FIGS. 6A to 6C are examples of various composite gates using the logic circuit arrangement of the present invention. FIG. 6A shows a 2-input NAND gate in which two switching MESFET-$Q_{SW1}$ and MESFET-$Q_{SW2}$ are cascade-connected; FIG. 6B illustrates an OR/NAND gate in which two switching MESFET-$Q_{SW1}$ and MESFET-$Q_{SW2}$ are connected in parallel, to which a switching MESFET-$Q_{SW3}$ is cascade-connected; and FIG. 6C depicts an AND/NOR gate in which two switching MESFET-$Q_{SW1}$ and MESFET-$Q_{SW2}$ are cascade-connected, to which a switching MESFET-$Q_{SW3}$ is connected in parallel.

Hereinafter, the switching characteristic of the logic circuit of the present invention will be explained. The logic gates in a logic circuit generally drive a plurality of gates. In this case, there is a wire connecting the output terminal of the logic gate to the input terminal of the gate of the next state, and the wire never fails to have a capacitance. Therefore, it is important to have the switching characteristics of logic gates for an integrated circuit obtained taking into account the fan-out and load capacitance at the output terminal.

A practical evaluation of the switching characteristic of the inverter circuit of the present embodiment is done for a case where the amount of fan-out is 3 and there is a load capacitance of 300 fF between the output terminal and the grounding conductor. These values are generally used as the performance evaluation standards for the large-scale integrated circuit. Under such conditions, the switching characteristics of the inverter circuit of the present embodiment evaluated at the oscillating frequency of a seven-stage ring oscillator, are as follows:

Delay time $T_{pd}=351$ psec/gate
Power consumption $P_d=0.12$ mW/gate

For comparison, those of the DCFL gate evaluated under the same load conditions are as follows:

Delay time $T_{pd}=920$ psec/gate
Power consumption $P_d=0.18$ mW/gate

Here, the gate width of the load MESFET of the DCFL GATE is 1.5 μm, and the gate width of the switching MESFET is 3 μm.

As described above, the logic gate of the present invention enables a much higher-speed operation at as much lower power consumption as that in DCFL gates used in conventional GaAs integrated circuits. In comparison in terms of power consumption times delay time (the product of $P_d$ and $T_{pd}$) generally used in evaluation of integrated circuits, the DCFL circuit has 165.6 fJ while the logic gate of the present invention has 42.1 fJ, four times as high as the former.

In the first embodiment circuit of FIG. 2, when a Hi level is supplied, or when a Lo level output is produced, the feedback stage B carries almost no current. Because of this, the amount of level shift by the level shift diode $D_1$ is smaller than when current flows, or during the Hi level output. As a result, the potential at internal node MHD slightly rises, which somewhat turns on the pull-up MESFET-$Q_{PU}$, allowing current to flow through the buffer stage C. The output Lo level potential becomes a little higher than the GND level. This leads to an increase in the current draw and a reduction in the operating margin.

Figure 7:
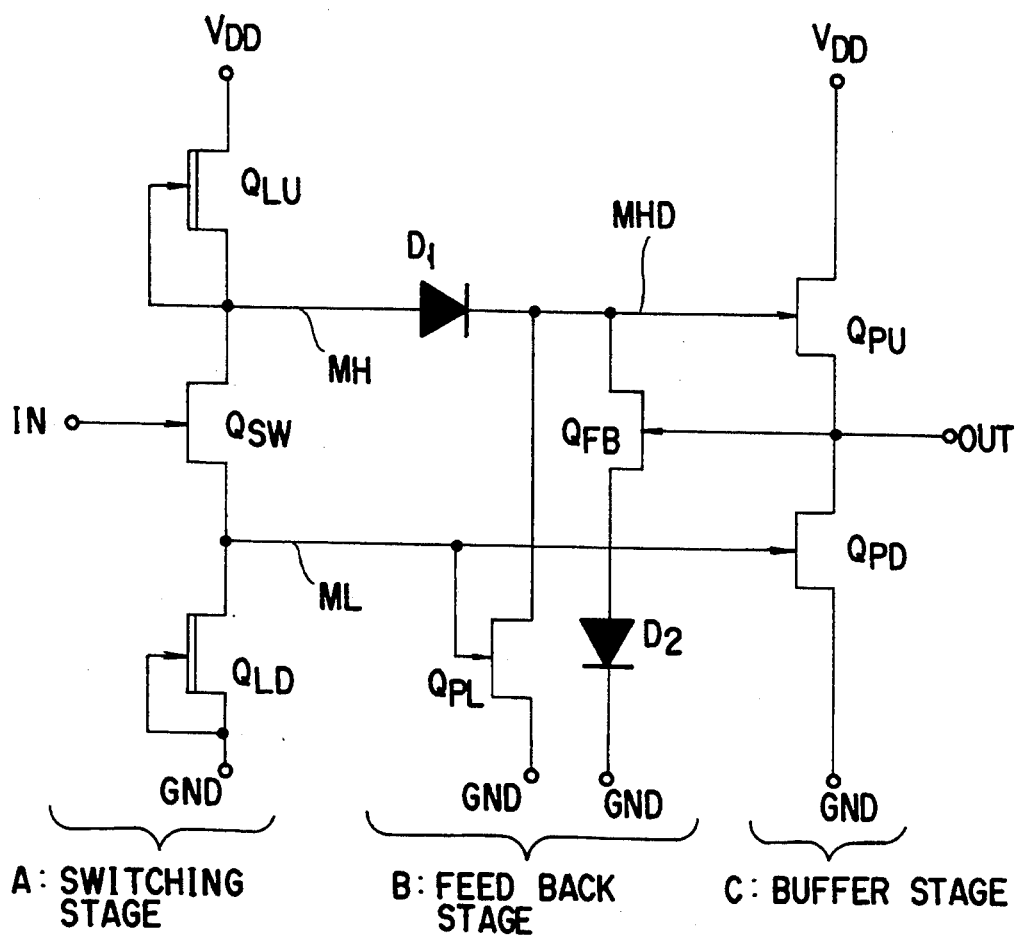
FIG. 7 is a circuit diagram of an inverter circuit according to a second embodiment of the present invention.

FIG. 7 shows an inverter circuit according to a second embodiment of the present invention, which is an improved version of the circuit of the FIG. 2 embodiment, taking into account the above-mentioned things. In the second embodiment, based on the FIG. 2 circuit configuration, another E-type MESFET-$Q_{PL}$ for level regulation is added to the feedback stage B. The level-regulating MESFET-$Q_{PL}$ has its drain connected to node MHD, its gate connected to node ML, and its source connected to GND.

In the circuit of the second embodiment, the MESFET-$Q_{PL}$ is completely off when the input IN is at the Lo level. When the input IN goes to the Hi level, the potential at node ML rises, which turns on MESFET-$Q_{PL}$, dropping the potential at the internal node MHD to near the potential at GND. As a result, the pull-up MESFET-$Q_{PU}$ of the buffer stage C is completely off, allowing almost no current to flow through the buffer stage C. The output Lo level potential drops to near the GND level.

As described above, addition of MESFET-$Q_{PL}$ does not impair the advantages of the present invention that a multi-input NOR gate arrangement and a composite gate arrangement are possible, and the output Hi level is stable regardless of the fan-out.

FIG. 8 shows an inverter circuit according to a third embodiment of the present invention, which is an improved version of the circuit of the FIG. 2 embodiment. In the third embodiment, a current-limiting FET-$Q_{CL}$ is connected to the input of the lower stage $Q_{SW2}$ of cascade-connected switching FET-$Q_{SW1}$ and FET-$Q_{SW2}$ in the 2-input NAND gate. In such a cascade arrangement, when the input to the upper stage $Q_{SW1}$ is low and the input to the lower stage $Q_{SW2}$ is high, a normal NOR arrangement does not work which allows current in the load $Q_{LU}$ to flow into the load $Q_{LD}$ to raise the potential at ML. As a result, the input rising characteristic viewed from the input terminal of $Q_{SW2}$ does not differ much from that of a single Schottky gate stage. When the Hi level is set larger than the forward-direction rising voltage of the Schottky gate, current is allowed to flow in, which raises the potential at ML, turning on $Q_{PD}$ to allow current to flow through the buffer stage. The $Q_{CL}$ is provided to avoid such a state. When the upper-stage input level is low, the $Q_{CL}$ turns off, preventing current from flowing into the gate of the $Q_{SW2}$. When the upper-stage input is high, the $Q_{CL}$ turns on, allowing the lower-stage input potential to be transferred to $Q_{SW2}$ with almost no change.

Figure 9:
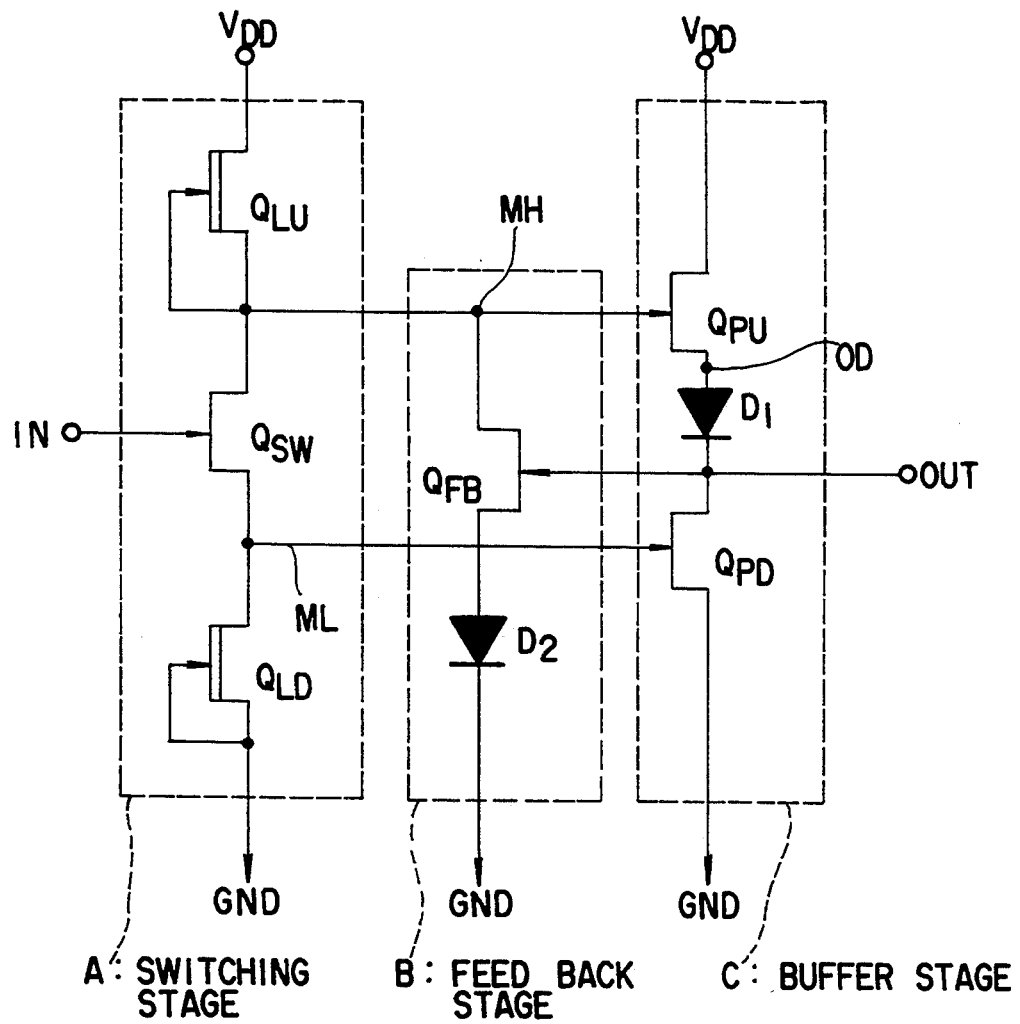
FIG. 9 is a circuit diagram of an inverter circuit according to a fourth embodiment of the present invention.

FIG. 9 shows an inverter circuit according to a fourth embodiment of the present invention. The arrangement of this inverter circuit is basically the same as that of FIG. 2 except that the Schottky diode $D_1$ in the feedback stage B is removed, and instead is inserted between the $Q_{PU}$ and $Q_{PD}$ in the buffer stage C. The drain of $Q_{SW}$ is directly connected to the gate of $Q_{PU}$, and $D_1$ is connected between the source of $Q_{PU}$ (its node is indicated by OD) and the output terminal OUT.

A direct-current (DC) action of the inverter circuit of the fourth embodiment is almost the same as that of the first embodiment. When the input signal is at a high (Hi) level, $Q_{SW}$ turns on, and the potential at nodes MH and ML are determined as a potential that allows $Q_{LU}$ and $Q_{LD}$ to flow current $I_{SW}$. Here, with the power supply voltage of $V_{DD}=2$ V and GND=0 V, if the potentials at nodes ML and MH are brought to ML=0.4 V and MH=0.5 V, respectively, when $Q_{SW}$ is on, $Q_{PD}$ in the buffer stage C turns on. At this time, because node OD is level-shifted by diode $D_1$, which brings the gate voltage of $Q_{PU}$ to almost zero, thereby producing a low (Lo) level output with the passing-through current in the buffer stage C suppressed to a minimum.

When the input signal is at the low level, $Q_{SW}$ turns off. At this time, node ML's potential is almost 0 V because $Q_{LD}$ is off, which turns off $Q_{PD}$. The current $I_L$ from the current source $Q_{LU}$ flows in a path running through $Q_{FB}$ and $D_2$ in that order, forming a current mirror circuit. At this time, the output voltage $V_{OUT}$ is determined as a gate voltage required for $Q_{FB}$ to flow current $I_L$. The voltage at node MH is determined as a gate voltage ($V_{MHD}-V_{OUT}$) needed for $Q_{PU}$ to supply a current corresponding to the output voltage $V_{OUT}$ to a load (generally, the gate input of the next stage) connected to the output terminal.

As described above, the Hi level output voltage of the inverter circuit of the fourth embodiment can be determined by the circuit constants of the internal circuit without being affected by the load connected to the output terminal. This means that level fluctuations due to the amount of fan-out is small and a great noise margin and a high logical capability are assured.

Next, an alternating-current (AC) action of the inverter of the fourth embodiment will be explained. When the input voltage $V_{IN}$ changes from the Lo level to the Hi level, node ML goes to approximately 0.4 V, causing $Q_{PD}$ to turn on. Since node MH is dropped from approximately 1.7 V to approximately 0.5 V, this allows the diode $D_1$ to turn off $Q_{PU}$. As a result, all of the current driving force of $Q_{PD}$ works only for removing the charges stored in the capacitance parasitic to the output terminal, causing the output voltage $V_{OUT}$ to drop to approximately to 0 V swiftly.

When the input voltage $V_{IN}$ changes from the Hi level to the Lo level, node ML is dropped to near 0 V immediately, causing $Q_{PD}$ to turn off. Node MH is charged by the current from the load $Q_{LU}$, which turns on $Q_{PU}$, placing the output terminal at the Hi level. At this time, $Q_{FB}$ remains off until the output voltage $V_{OUT}$, the voltage at its gate, is charged to a sufficiently high potential. Because of this, when it takes a long time for $Q_{PU}$ to charge the output terminal because of the large parasitic capacitance at the output terminal, node MH rises to a high potential, enhancing the current driving capability of $Q_{PU}$. In a state where the output voltage $V_{OUT}$ is sufficiently high, $Q_{FB}$ turns on, which forms a current mirror circuit as explained in the DC action, dropping the potential at node MH to the potential in a normal state.

As described above, since $Q_{PU}$ can flow a large current only when the output terminal is charged, high speed switching is possible even if there is a large parasitic capacitance. In the normal state where the switching is completed after the charging of the output terminal, the gate voltage MH is dropped, allowing a very small current to flow. This means that the static current draw is reduced remarkably.

In the present embodiment, the switching stage A only has to drive the relatively small capacitance of the feedback stage B and buffer stage C, making it possible to set the load current for a small amount. The large capacitance parasitic to the output terminal is driven fast by the buffer stage C that does not carry a constant current. Thus, high-speed switching is possible at low power consumption as with the first embodiment.

Hereinafter, the effects of this embodiment will be explained using a practical example. A basic device used is a GaAs MESFET with a gate length of 0.5 μm. The dimensions (gate width) of each element in FIG. 9 are set as follows:

$Q_{LU}$: 2 μm, $Q_{SW}$: 10 μm, $Q_{LD}$: 3 μm
$Q_{FB}$: 2 μm, $D_2$: 4 μm
$Q_{PU}$: 20 μm, $D_1$: 20 μm, $Q_{PD}$: 20 μm $Q_{LU}$ and $Q_{LD}$ are of the D type with a threshold voltage of $-0.3$ V. $D_1$ and $D_2$, which are D-type MESFETs whose source and drain are short-circuited, are used as diodes. The other MESFETs are of the E type with a threshold voltage of $+0.1$ V. The power supply voltage has $V_{DD}=2$ V and GND=0 V.

Under such conditions, a 10-input NOR gate circuit using inverter circuits of the present embodiment as basic components, and its input-output characteristics are shown in FIGS. 10A and 10B, respectively. For reference, FIG. 10B shows the inverter's transfer characteristic, and that in cases where a Lo level of 0.1 V and 0.2 V is supplied to those ($V_{INEX}$) of the 10 inputs other than the inputs to which the switching signal is supplied.

Figure 11A:
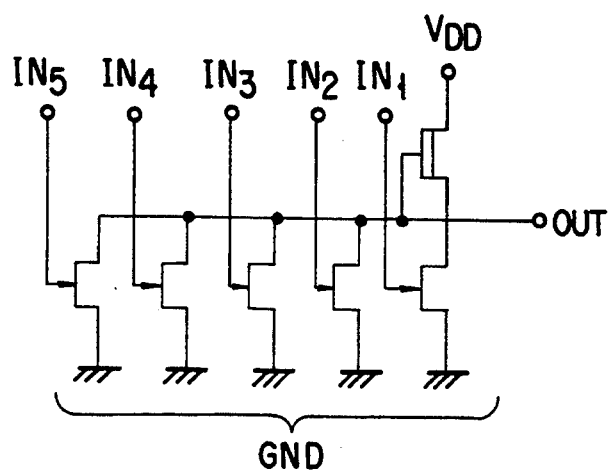
FIGS. 11A and 11B are a schematic diagram of a 5-input NOR circuit using a DCFL circuit, and its input-output characteristic diagram, respectively.
Figure 11B:
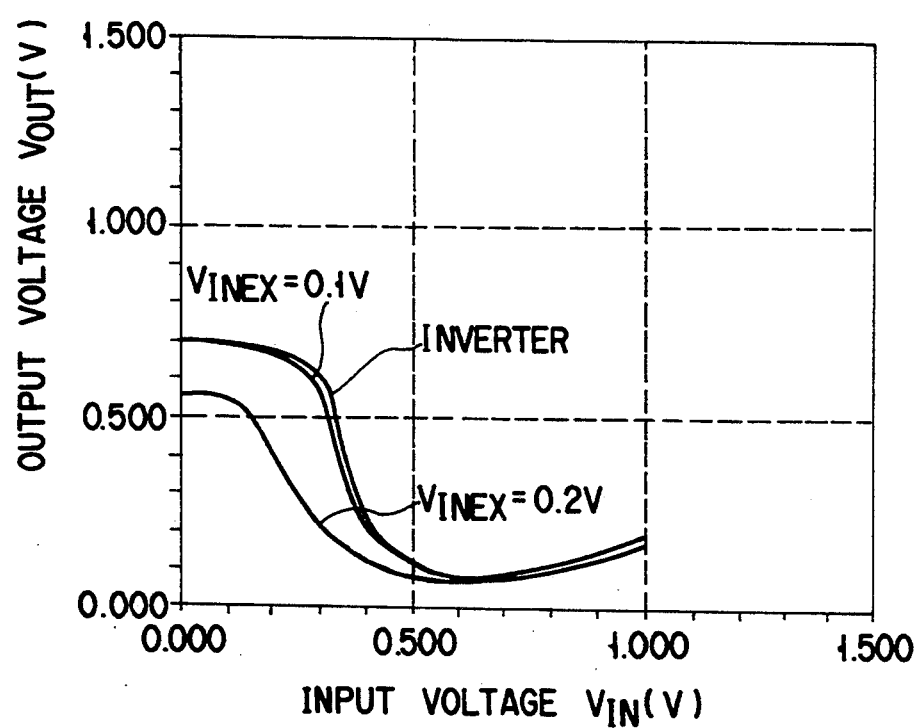

FIGS. 11A and 11B show a schematic diagram of a DCFL 5-input NOR gate and its input-output characteristics for comparison.

From the comparison of the measurements of the transfer characteristic in FIGS. 10B and 11B, it can be seen that in the DCFL circuit, when a normal Lo level, $V_{INEX}=0.1$ V, is supplied, it exhibits the proper transfer characteristic, but when a little high Lo level, $V_{INEX}=0.2$ V, is supplied (assuming that there is a rise in potential due to the resistance of the GND wire and the like), the Hi level output drops significantly. In contrast to this, with the fourth embodiment, although the number of inputs is 10, twice that of the DCFL circuit, the proper transfer characteristic is maintained even when $V_{INEX}=0.2$ V. Thus, a sufficient operating margin is assured.

Figure 12B:
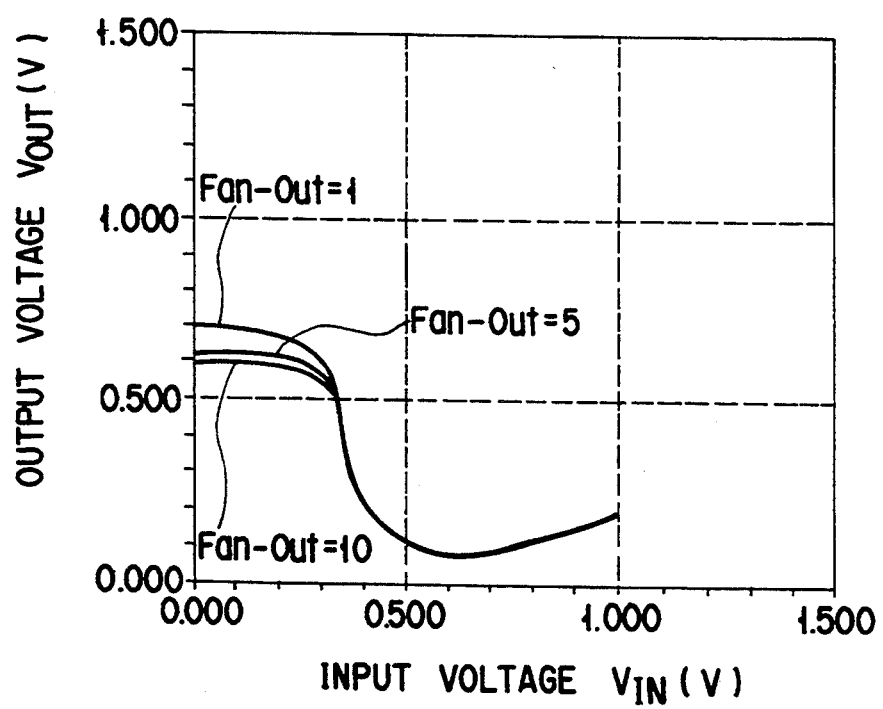

Next, the fan-out dependence of the transfer characteristic of the inverter circuit of the present embodiment and that of the DCFL circuit are shown in FIGS. 12A and 12B, respectively. FIG. 12A shows the transfer characteristic when the inverter of this embodiment is connected with one, five, and ten of the same inverters, that is, the amount of fan-out is 1, 5, and 10. FIG. 12B shows that for the DCFL circuit.

It can be seen that in the DCFL circuit, as the amount of fan-out increases, the Hi level drops accordingly, and at the fan-out=10, the Hi level decreases by approximately 0.1 V as compared with the amount of fan-out=1. In this embodiment, however, a drop in the level is as small as 30 mV even when the amount of fan-out=10, as shown in FIG. 12A.

Figure 13A:
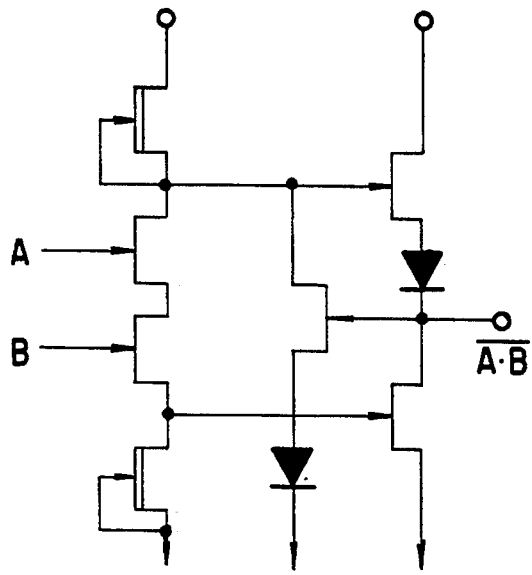
FIGS. 13A through 13C are schematic diagrams of composite gates based on an inverter circuit of the fourth embodiment.
Figure 13B:
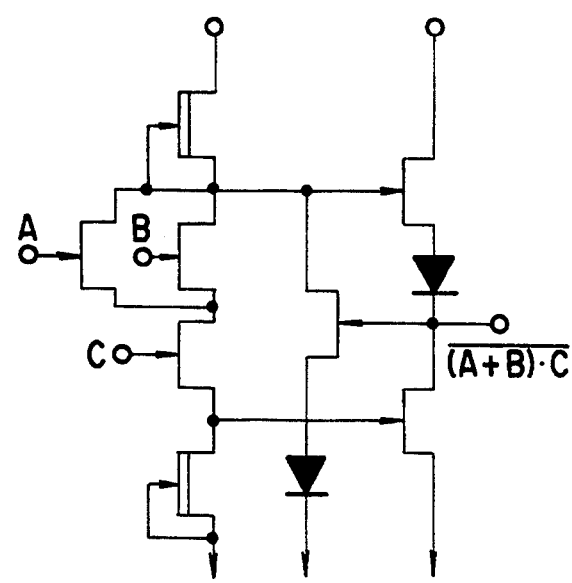
Figure 13C:
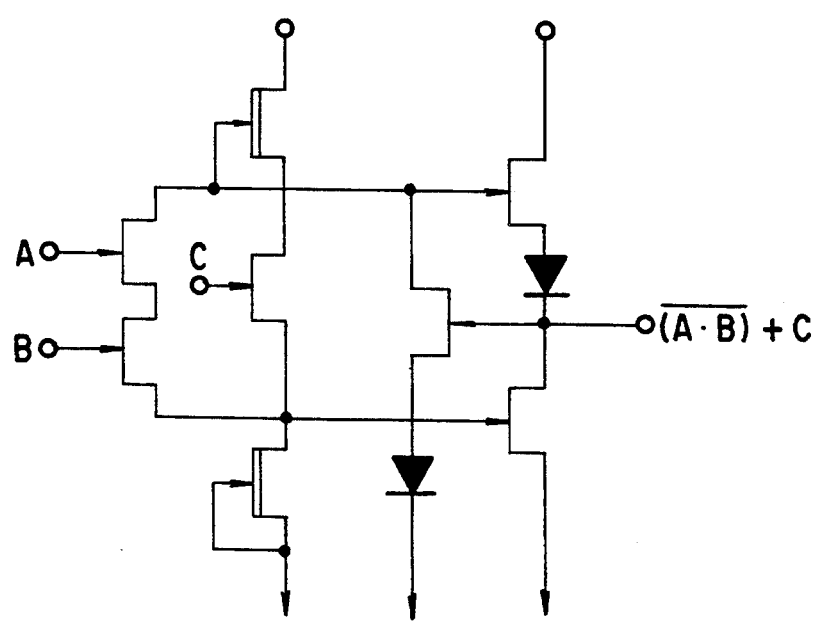

With the logic circuit arrangement of the present invention, it is easy to realize what is called a composite gate based on an arrangement in which switching elements are cascade-connected. FIGS. 13A to 13C are examples of various composite gates using the logic circuit arrangement of the present invention. FIG. 13A shows a 2-input NAND gate in which two switching MESFET-$Q_{SW1}$ and MESFET-$Q_{SW2}$ are cascade-connected; FIG. 13B illustrates an OR/NAND gate in which two switching MESFET-$Q_{SW1}$ and MESFET-$Q_{SW2}$ are connected in parallel, to which a switching MESFET-$Q_{SW3}$ is cascade-connected; and FIG. 13C depicts an AND/NOR gate in which two switching MESFET-$Q_{SW1}$ and MESFET-$Q_{SW2}$ are cascade-connected, to which a switching MESFET-$Q_{SW3}$ is connected in parallel.

Hereinafter, the switching characteristic of the logic circuit of the present invention will be explained. A practical evaluation of the switching characteristic of the inverter circuit of the present embodiment is done for a case where the amount of fan-out is 3 and there is a load capacitance of 300 fF between the output terminal and the grounding conductor. These values are generally used as the performance evaluation standards for the large-scale integrated circuit. Under such conditions, the switching characteristics of the inverter circuit of the present embodiment evaluated at the oscillating frequency of a seven-stage ring oscillator, are as follows:

Delay time $T_{pd}$=262 psec/gate
Power consumption $P_d$=0.21 mW/gate

For comparison, those of the DCFL gate evaluated under the same load conditions are as follows:

Delay time $T_{pd}$=920 psec/gate
Power consumption $P_d$=0.18 mW/gate

Here, the gate width of the load MESFET of the DCFL GATE is 1.5 μm, and the gate width of the switching MESFET is 3 μm.

As described above, the logic gate of the present invention enables a much higher-speed operation at as almost same power consumption as that in DCFL gates generally used in conventional GaAs integrated circuits. In comparison in terms of power consumption times delay time (the product of $P_d$ and $T_{pd}$) generally used in evaluation of integrated circuits, the DCFL circuit has 165.6 fJ, while the logic gate of the present invention has 55.02 fJ, three times as high as the former.

In the circuit of the FIG. 9 embodiment, when a Hi level is supplied, or when a Lo level output is produced, the feedback stage B carries almost no current. Because of this, the amount of level shift by the level shift diode $D_1$ is smaller than when current flows, or during the Hi level output. As a result, the potential at internal node MHD slightly rises, which somewhat turns on the pull-up MESFET-$Q_{PU}$, allowing current to flow through the buffer stage C. The output Lo level potential becomes a little higher than the GND level. This leads to an increase in the current draw and a reduction in the operating margin.

Figure 14:
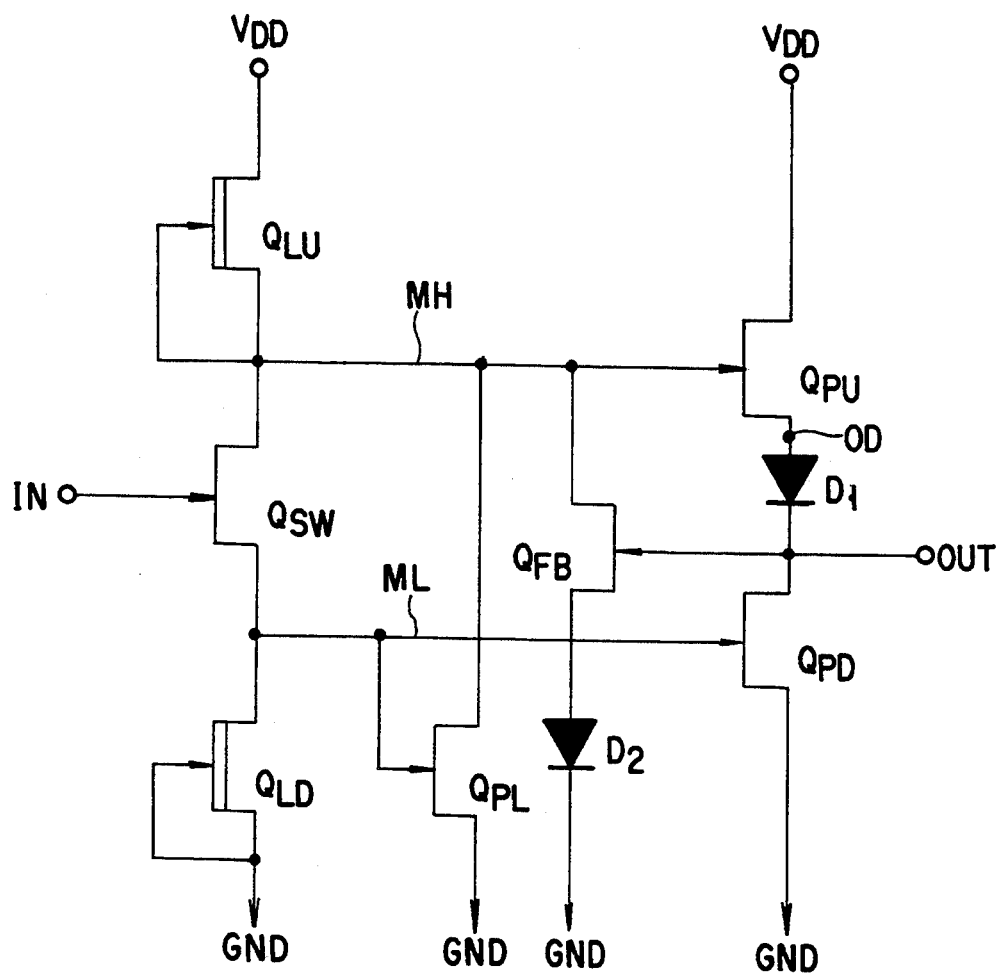
FIG. 14 is a circuit diagram of an inverter circuit according to a fifth embodiment of the present invention.

FIG. 14 shows an inverter circuit according to a fifth embodiment of the present invention, which is an improved version of the circuit of the FIG. 9 embodiment, taking into account the above-mentioned things. In this embodiment, based on the FIG. 9 circuit configuration, another E-type MESFET-$Q_{PL}$ for level regulation is added to the feedback stage B. The level-regulating MESFET-$Q_{PL}$ has its drain connected to node MH, its gate connected to node ML, and its source connected to GND.

In the fifth embodiment, the $Q_{PL}$ is completely off when the input is at the Lo level. When the input goes to the Hi level, the potential at node ML rises, which turns on $Q_{PL}$, dropping the potential at the internal node MH to near the potential at GND. As a result, the pull-up $Q_{PU}$ of the buffer stage C is completely off, allowing almost no current to flow through the buffer stage C. The output Lo level potential drops to near the GND level. In this way, addition of $Q_{PL}$ does not impair the advantages of the present invention that a multi-input NOR gate arrangement and a composite gate arrangement are possible, and the output Hi level is stable regardless of the fan-out.

FIG. 15 shows an inverter circuit according to a sixth embodiment of the present invention, which is an improved version of the circuit of the FIG. 9 embodiment. In this embodiment, a current-limiting $Q_{CL}$ is connected to the input of the lower stage $Q_{SW2}$ of cascade-connected switching $Q_{SW1}$ and $Q_{SW2}$ in the 2-input NAND gate, as explained in the third embodiment. In such a cascade arrangement, as with the third embodiment, when the upper-stage input level is low, the $Q_{CL}$ turns off, preventing current from flowing into the gate of the $Q_{SW2}$. When the upper-stage input is high, the $Q_{CL}$ turns on, allowing the lower-stage input potential to be transferred to $Q_{SW2}$ with almost no change.

Although the logic circuit of the present invention has been explained using the embodiments, the invention may be practiced or embodied in still other ways without departing from the spirit or essential character thereof.

For instance, while in the embodiments, the constant-current source composed of a D-type MESFET is used as the load, it may be replaced with a resistive element. For a level shift means, a constant-current source may be used which has the gate and source connected by means of a p-n junction diode or a D-type MESFET instead of the Schottky diode. While in the embodiments, a power supply voltage combination of 2V and 0 V is used, that of 3 V and 0V may be used as necessary. A negative power supply with 0V and −2 V may be used. For the source power supply for the feedback stage, a separate power supply may be provided independently of the switching stage and buffer stage, to provide a more negative potential, for example.

The dimensions and threshold values of the respective circuit components in the embodiments may be changed as required. For instance, a MESFET with a greater gate width or a D-type MESFET may be used as the feedback MESFET-$Q_{FB}$ in the feedback stage. This makes it possible to set the Hi level somewhat lower. Conversely, by using a MESFET with a higher threshold value or a smaller gate width as the feedback MESFET-$Q_{FB}$, a more Hi level output may be obtained. Those circuit conditions may be set as required, depending on the characteristics of the elements, temperature circumstances, and others.

Further, while in the aforementioned embodiments, only GaAs MESFETs are used, other semiconductor materials and p-n junction gate FETs may be used to obtain the effects that the present invention provides.

Additional advantages and modifications will readily occur to those skilled In the art. Therefore, the present invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A semiconductor logic integrated circuit powered by at least a first through fifth power supplies and having a first logic input terminal and a logic output terminal, comprising:

a switching stage which contains a first load with a first end and a second end, the first end being connected to the first power supply, a second load with a first end and a second end, the first end being connected to the second power supply, and a first junction gate field-effect transistor having a drain connected to the second end of said first load, a source connected to the second end of said second load, and a gate connected to said first logic input terminal;

a buffer stage which contains a second junction gate field-effect transistor having a drain connected to the third power supply, a source connected said logic output terminal, and a gate, and a third junction gate field-effect transistor having a drain connected to said logic output terminal, a source connected to the fourth power supply, and a gate connected to the source of said first junction gate field-effect transistor; and a feedback stage which contains a level shift element having a first end connected to the drain of said first junction gate field-effect transistor and a second end connected to the gate of said second junction gate field-effect transistor, and a fourth junction gate field-effect transistor having a drain connected to the second end of said level shift element, and a gate connected to said logic output terminal, and a source connected to the fifth power supply.

2. A semiconductor logic integrated circuit according to claim 1, wherein said feedback stage further contains a level shift element having a first end connected to the source of said fourth junction gate field-effect transistor and a second end connected to the fifth power supply.

3. A semiconductor logic integrated circuit according to claim 1, wherein
said semiconductor logic integrated circuit further comprises a second logic input terminal,
said switching stage further contains a fifth junction gate field-effect transistor having a drain connected to the source of said first junction gate field-effect transistor, a source connected to said second load, and a gate connected to said second logic input terminal.

4. A semiconductor logic integrated circuit according to claim 3, wherein said switching stage further contains a sixth junction gate field-effect transistor having a source connected to the gate of said fifth junction gate field-effect transistor, a drain connected to said second logic input terminal, and a gate connected to said first logic input terminal.

5. A semiconductor logic integrated circuit according to claim 1, wherein
said semiconductor logic integrated circuit is further powered by a sixth power supply, and
said feedback stage further contains a seventh junction gate field-effect transistor having a drain connected to the gate of said second junction gate field-effect transistor, a gate connected to the source of said first junction gate field-effect transistor, and a source connected to the sixth power supply.

6. A semiconductor logic integrated circuit according to claim 5, wherein said feedback stage further contains a level shift element having a first end connected to the source of said fourth junction gate field-effect transistor and a second end connected to the fifth power supply.

7. A semiconductor logic integrated circuit powered by at least a first through fifth power supplies and having a first logic input terminal and a logic output terminal, comprising:

a switching stage which contains a first load with a first end and a second end, the first end being connected to the first power supply, a second load with a first end and a second end, the first end being connected to the second power supply, and a first junction gate field-effect transistor having a drain connected to the second end of said first load, a source connected to the second end of said second load, and a gate connected to said first logic input terminal;

a buffer stage which contains a level shift element with a first end and a second end, the first end being connected to sid logic output terminal, a second junction gate field-effect transistor having a drain connected to the third power supply, source connected to the second end of said level shift element, and a gate connected to the drain of said first junction gate field-effect transistor, and a third junction gate field-effect transistor having a drain connected to said logic output terminal, a source connected to the fourth power supply, and a gate connected to the source of said first junction gate field-effect transistor;

a feedback stage which contains a fourth junction gate field-effect transistor having a drain connected to the gate of said second junction gate field-effect transistor, a gate connected to said logic output terminal, and a source connected to the fifth power supply, said semiconductor logic integrated circuit being further powered by a sixth power supply, and said feedback stage further containing a seventh junction gate field-effect transistor having a drain connected to the gate of said second junction gate field-effect transistor, a gate connected to the source of said first junction gate field-effect transistor, and a source connected to the sixth power supply.

8. A semiconductor logic integrated circuit according to claim 7, wherein said feedback stage further contains a level shift element having a first end connected to the source of said fourth junction gate field-effect transistor and a second end connected to the fifth power supply.

* * * * *